United States Patent [19]

Umezawa

[11] Patent Number: 5,390,076
[45] Date of Patent: Feb. 14, 1995

[54] COOLING STRUCTURE FOR INTEGRATED CIRCUITS

[75] Inventor: Kazuhiko Umezawa, Tokyo, Japan

[73] Assignee: NEC Corporation, Tokyo, Japan

[21] Appl. No.: 7,739

[22] Filed: Jan. 22, 1993

[30] Foreign Application Priority Data

Jan. 22, 1992 [JP] Japan .................................. 4-031634

[51] Int. Cl.[6] ............................................ H05K 7/20
[52] U.S. Cl. .................... 361/689; 165/80.4; 165/908; 257/714; 361/699
[58] Field of Search ............ 165/80.4, 185, 908; 257/714–716, 719, 721–722; 361/688–689, 699, 704, 707, 711, 714, 717–718, 722

[56] References Cited

U.S. PATENT DOCUMENTS

| 4,226,281 | 10/1980 | Chu | 165/185 |
| 4,882,654 | 11/1989 | Nelson et al. | 361/386 |
| 4,928,207 | 5/1990 | Chrysler et al. | 361/385 |
| 4,942,497 | 7/1990 | Mine et al. | 165/80.4 |
| 4,977,444 | 12/1990 | Nakajima et al. | 165/80.4 |
| 5,023,695 | 6/1991 | Umezawa et al. | 361/382 |
| 5,166,863 | 11/1992 | Shmunis | 361/382 |

FOREIGN PATENT DOCUMENTS

| 0341950 | 11/1989 | European Pat. Off. . | |
| 0411119 | 2/1991 | European Pat. Off. . | |
| 60-160150 | 8/1985 | Japan . | |
| 2206866 | 9/1987 | Japan | 257/714 |
| 3044748 | 2/1988 | Japan | 257/714 |

OTHER PUBLICATIONS

S. Oktay et al., "A Conduction-Cooled Module for High-Performance LSI Devices", published in IBM J. Res. Develop., vol. 26, No. 1, Jan. 1982, pp. 55–66.

IBM Technical Disclosure Bulletin, vol. 33, No. 1A, Jun. 1990, pp. 293–295, "Fault-Tolerant Immersion Cooling".

IBM Technical Disclosure Bulletin, vol. 31, No. 5, Oct. 1988, pp. 141–142, "Multi-Chip Package with Cooling by a Spreader Plate In Contact with a Chip Having Cylindrical Holes Mating with an Inverse Frame Providing Flow Within Its Pins".

Primary Examiner—Gregory D. Thompson
Attorney, Agent, or Firm—Sughrue, Mion, Zinn, Macpeak & Seas

[57] ABSTRACT

A cooling structure for integrated circuits including a plurality of integrated circuits, and a wiring substrate for mounting these integrated circuits and forming connections to a power source and signals. A plurality of cylindrical pistons are provided, with each having an open upper portion, a pair of protruding portions on an outside surface of the open upper portion and a spherical lower surface. A housing is provided which has holes in positions corresponding to positions of the respective integrated circuits on the wiring substrate, each hole having an O-ring groove formed in an inner wall thereof for receiving an O-ring and receiving the piston therein. The cooling structure further includes a first cover covering the pistons and the housing and having nozzles for jetting liquid coolant vertically to bottom surfaces of the respective pistons and coolant outlet ports for circulating the liquid coolant which has cooled the interiors of the pistons, and a second cover having coolant passages in the form of grooves for circulating the liquid coolant.

6 Claims, 7 Drawing Sheets

FIG. 14
PRIOR ART

COOLING STRUCTURE FOR INTEGRATED CIRCUITS

BACKGROUND OF THE INVENTION

The present invention relates to a cooling structure for integrated circuits to be used in an electronic device such as a data processor and, particularly, to a cooling structure in which liquid coolant is circulated in the vicinity of the integrated circuits to cool them by transmitting heat generated by these integrated circuits to the liquid coolant.

Examples of a conventional cooling structure for integrated circuits of this type are disclosed in "A Conduction-Cooled Module for High-Performance LSI Devices" by S. Oktay and H. C. Kammerer, published in IBM J. RES. DEVELOP., Vol. 26, No. 1, January 1982 and in Japanese Patent Application Disclosure No. Sho 60-160150.

The former example shows a first conventional structure in which a spherical contact surface of a piston is pressed to a heat radiating surface of an integrated circuit formed on a wiring substrate by spring force to transmit heat generated in the integrated circuit through the piston, a gap filled with helium gas, a hat and an intermediate layer and, after heat is transmitted from the intermediate layer to a cooling plate, the latter is cooled by a coolant.

The latter example shows a second conventional cooling structure in which a heat conductive substrate, a deformable heat conductive member and a heat conductive plate are provided on a heat radiating surface of a chip on a printed circuit substrate and an elastically deformable bellows having a thin wall is provided on the heat conductive plate. Cooling is performed by jetting liquid coolant from a nozzle to the heat conductive plate within the bellows.

The cooling structure of the conventional integrated circuit which are disclosed in the above-mentioned articles have defects which will be described below.

First, the heat conduction coefficient obtainable in the first conventional structure is on the order of 0.1 to 0.5 [W/cm² °C.] since heat conduction is performed by forced convection of coolant in the coolant passage within the cooling plate. Therefore, the cooling capacity thereof may be lowered short when power consumption is increased with increase of integration density of the integrated circuit.

Secondly, in the second conventional structure which uses the thin-walled bellows, corrosion of the bellow may occur due to liquid coolant, in which case the coolant may leak, affecting the integrated circuit adversely.

SUMMARY OF THE INVENTION

An object of the present invention is to provide a cooling structure for use in an integrated circuit, which is capable of cooling the integrated circuit efficiently while preventing coolant from leaking out.

BRIEF DESCRIPTION OF THE DRAWINGS

The features and advantages of the present invention will become apparent from the following description when taken in conjunction with the accompanying drawings in which.

In these drawings, same reference numerals depict the same constitutional components, respectively.

DETAILED DESCRIPTION OF THE PREFERRED EMBODIMENTS

First of all, in order to the facilitate understanding of an object, construction and operation of the cooling structure according to the present invention, a conventional cooling structure of an integrated circuit will be described with reference to the drawings.

Figure 13:
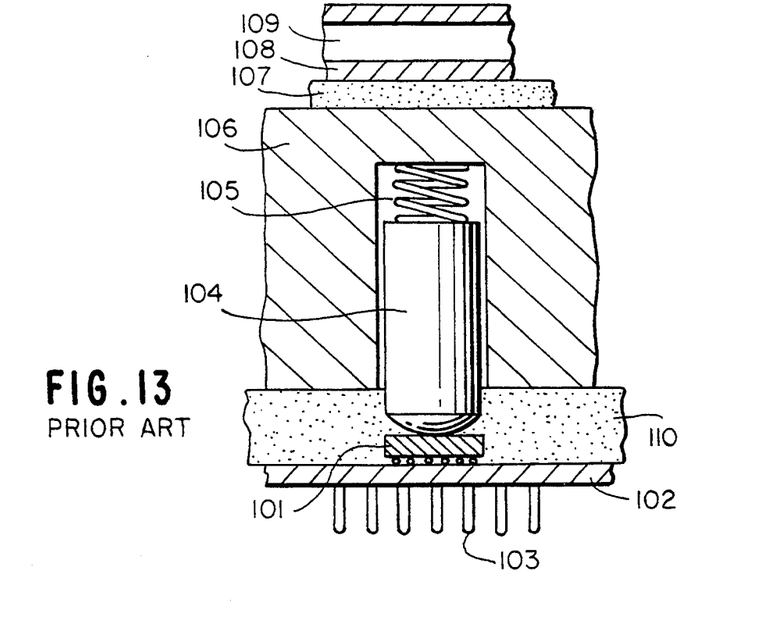
FIG. 13 is a longitudinal cross section of a conventional cooling structure of an integrated circuit.

Referring to FIG. 13, a conventional cooling structure comprises integrated circuits 101, a wiring substrate 102 having I/O pins 103, a piston 104 provided for each integrated circuit and having a spherical surface to be in contact with the integrated circuit, a spring 105 for biasing the piston 104 against the associated integrated circuit, a hat 106 for receiving the pistons 104, an intermediate layer 107, a cooling plate 108, coolant 109 and helium gas 110.

The piston 104 is urged elastically against a heat radiating surface of the integrated circuit 101 by the spring 105. Heat generated by the integrated circuit 101 is transmitted to the piston 104 through the resilient contact between the latter and the integrated circuit and then to the hat 106 and the intermediate layer 107 through a space filled with helium gas 110. This heat is transmitted from the intermediate layer 107 to the cooling plate 108 and then to the coolant 109.

Figure 14:
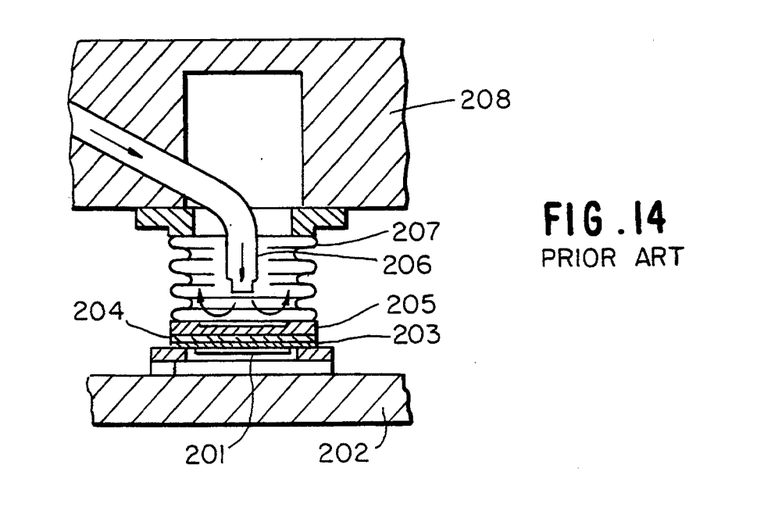
FIG. 14 is a longitudinal cross section of another conventional cooling structure of an integrated circuit.

Referring to FIG. 14 showing another example of the conventional cooling structure, it comprises an IC chip 201, a printed circuit substrate 202, a heat conductive substrate 203, a deformable heat conductor 204, a heat conductive plate 205, a nozzle 206, a bellows 207 and a cooling header 208. Heat generated by the chip 201 on the printed circuit substrate 202 is transmitted through the heat conductive substrate 203, the deformable heat conductor 204 and the heat conductive plate 205. During this heat conduction, liquid coolant is jetted from the nozzle 206 to the heat conductive plate 205 within the bellows 207 to absorb heat and heat absorbed coolant is discharged from the bellows 207 to a path provided within the cooling header 208.

An embodiment of the present invention will now be described with reference to the drawings.

Figure 1:
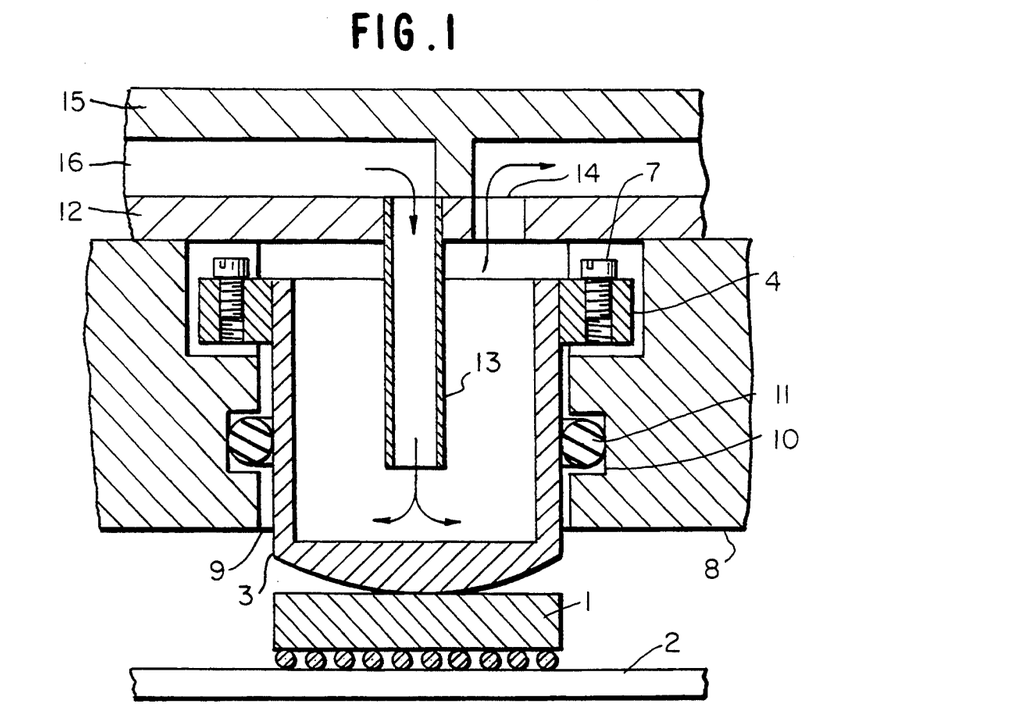
FIG. 1 is a longitudinal cross section of a first embodiment of the present invention.

Referring to FIG. 1, a first embodiment of the present invention comprises a plurality of integrated circuits 1, and a wiring substrate 2 for mounting these integrated circuits and forming connections to a power source and signals. A plurality of cylindrical pistons 3 are provided, with each having an open upper portion, a pair of protruding portions 4 on an outside surface of the open upper portion and a spherical lower surface. A housing 8 is provided having holes 9 in positions corresponding to positions of the respective integrated circuits on the wiring substrate, each hole 9 having an O-ring groove 10 formed in an inner wall thereof for receiving an O-ring 11 and receiving the piston therein. The cooling structure farther comprises a first cover 12 covering the pistons 3 and the housing 8 and having nozzles 13 for jetting liquid coolant vertically to bottom surfaces of the respective pistons 3 and coolant outlet ports 14 for circulating the liquid coolant which has cooled the interiors of the pistons, and a second cover 15 having coolant passages 16 in the form of grooves for circulating the liquid coolant.

Figure 2:
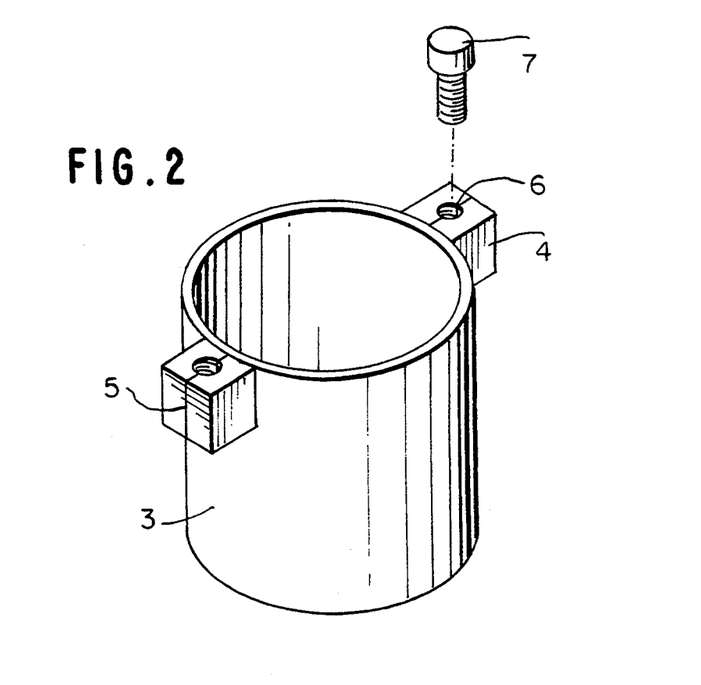
FIG. 2 is a perspective view of a piston shown in FIG. 1.
Figure 3:
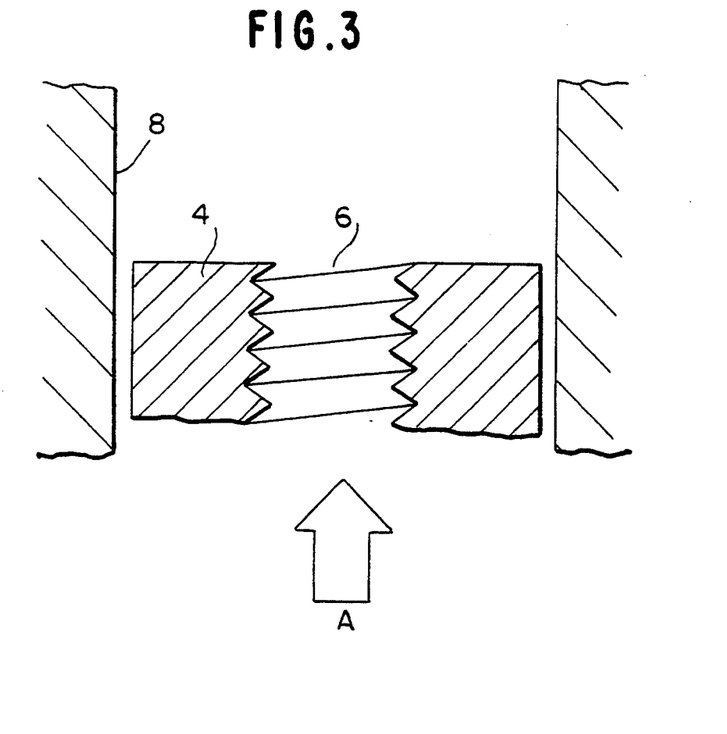
FIG. 3 is a longitudinal cross section of a protruding portion shown in FIG. 1.
Figure 4:
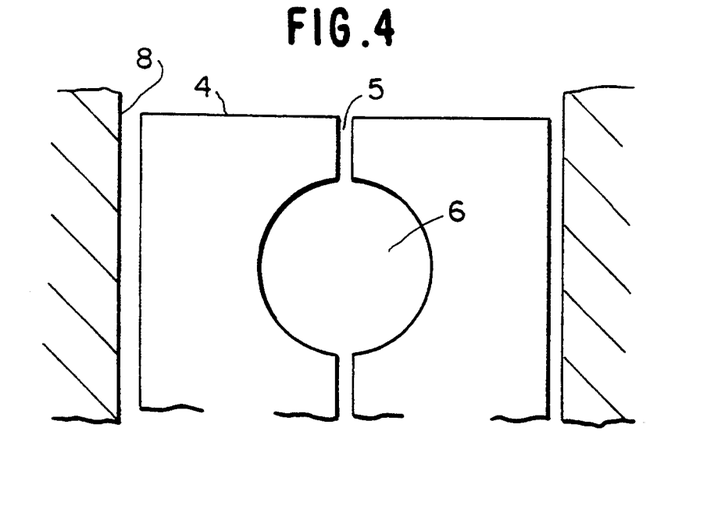
FIG. 4 is a rear side view of the protruding portion shown in FIG. 3 when viewed in a direction of arrow A.
Figure 5:
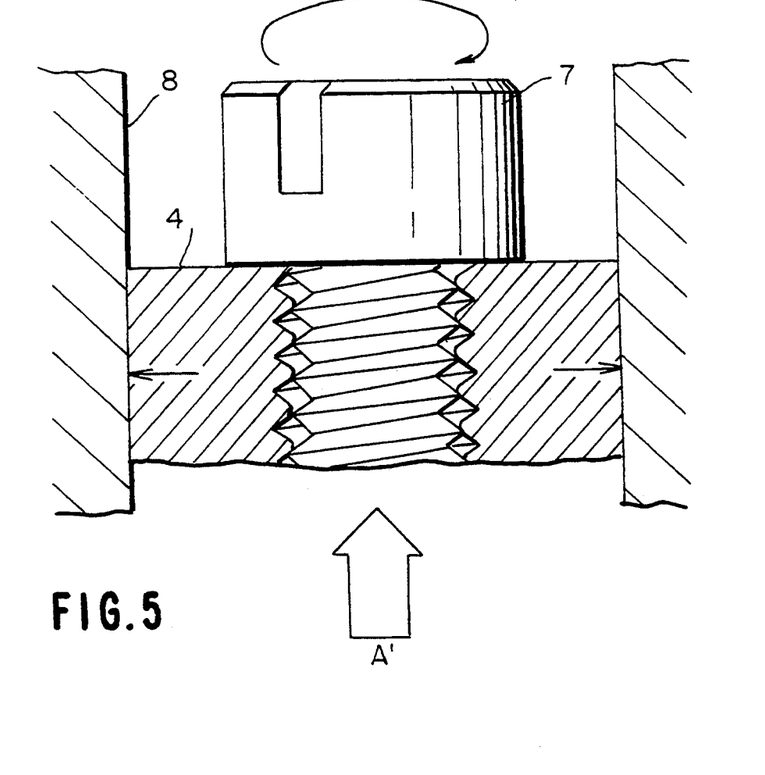
FIG. 5 is a longitudinal cross section of the protruding portion when the piston shown in FIG. 1 is fixed to a housing by screws.
Figure 6:
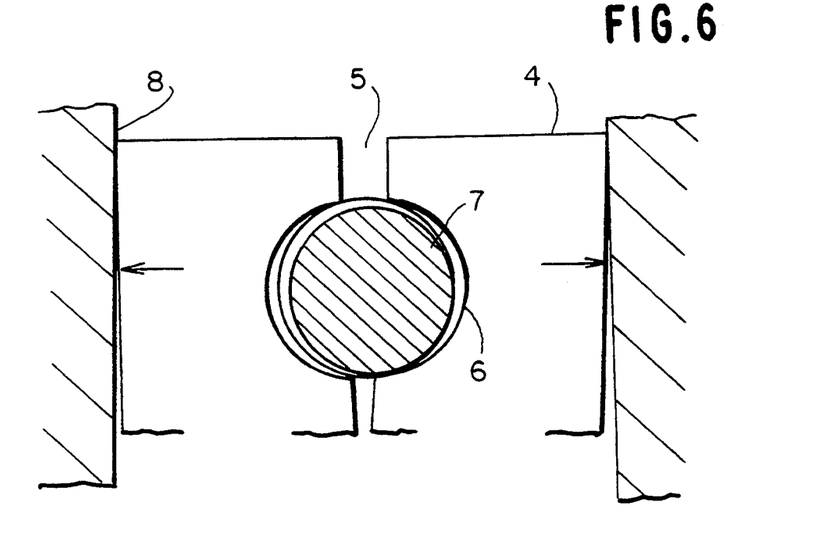
FIG. 6 is a rear side view of the protruding portion shown in FIG. 5 when viewed in a direction of arrow A.

The pistons 3 are made of metal material such as copper which has high heat conductivity and anti-corrosive properties and are mounted correspondingly in position to the respective integrated circuits 1 on the wiring substrate 2. The piston 3 has the pair of protruding portions 4 on the outside surface of the open upper portion thereof as shown in FIG. 2. Each protruding portion 4 is formed with a vertical slit 5 which can be expanded by driving a screw 7 into a screw hole 6 formed in the protruding portion 4. The lower surface of the piston 3 is spherical so that it can be maintained in stable contact with the heat radiating surface of the associated integrated circuits on the wiring substrate.

The housing 8 is formed with the holes 9 for receiving the pistons 3. An annular O-ring groove 10 for receiving an O-ring 11 and a pair of recesses for receiving the protruding portions 4 are formed in a wall of each hole 9. By driving the screws 7 into the screw holes 6, the protruding portions 4 of the piston 3 are expanded and come into frictional contact with the recesses of the hole 9, so that the piston 3 can be fixedly supported by the hole 9.

The first cover 12 is provided with a plurality of set of nozzles 13 and coolant outlet ports 14, each set being provided for each of the pistons 3 housed in the housing 8. The nozzles 13 serve to jet liquid coolant into the pistons 3 and the outlet ports 14 serve to discharge heat absorbed liquid coolant from the pistons. The second cover 15 provides, together with the first cover 12, a plurality of coolant supply/discharge passages 16 in the form of grooves.

Since the lower surface of the piston 3 is spherical, the pistons 3 can be in contact with the respective integrated circuits 1 on the wiring substrate 2 regardless of height and inclination of the integrated circuits. In order to make the contact between the piston and the integrated circuit reliable, the vertical slit 5 formed in the protruding portion 4 is expanded by driving the screw 7 into the screw hole 6 to frictionally fix the protruding portion 4 to the inner wall of the recess of the housing 8 as mentioned and shown in FIGS. 3 to 6.

Liquid coolant flows through one of the coolant passages 16 into the nozzle 13 associated therewith from which it is jetted vertically down to the bottom surface of the associated piston 3 where it absorbs heat from the integrated circuit 1. Then, it is discharged through a coolant outlet port 14 associated with the piston 3 to another coolant passage 16 associated with an adjacent piston 3 and repeats the heat absorbing for the latter piston 3, and so on.

According to the first embodiment, the contact of the lower surface of the piston 3 with the heat radiating surface of the integrated circuit is always kept stable regardless of the height and inclination of the heat radiating surface by regulating the position of the pistons 3 by means of the screw 7. Therefore, it is unnecessary to provide any intermediate members having large heat conductivity between the heat radiating surface of the integrated circuit and the lower surface of the piston.

Further, since coolant is directly jetted to the bottom surface of the piston, it is possible to make heat conduction to the coolant highly efficient.

That is, it is possible to minimize heat resistance between the integrated circuit and coolant by providing the stable contact between the integrated circuit and the piston.

Further, since the piston itself is not required to have a deformability, it can be made of high heat conductivity and corrosion resistive metal with a thick wall. Such a thick wall of the piston enhances the durability of the piston against corrosion thereof due to the coolant.

According to experiments conducted by the inventors, it has been found that heat conductivity between the piston and coolant can be 10 [W/m k] or more. Although, in the embodiment shown in FIG. 1, the integrated circuit 1 and the piston 3 are in direct contact, it is possible to provide a heat conductive compound paste containing silicon coil, etc., mixed with heat conductive filler such as metal oxides between the integrated circuit 1 and the piston 3.

Figure 7:
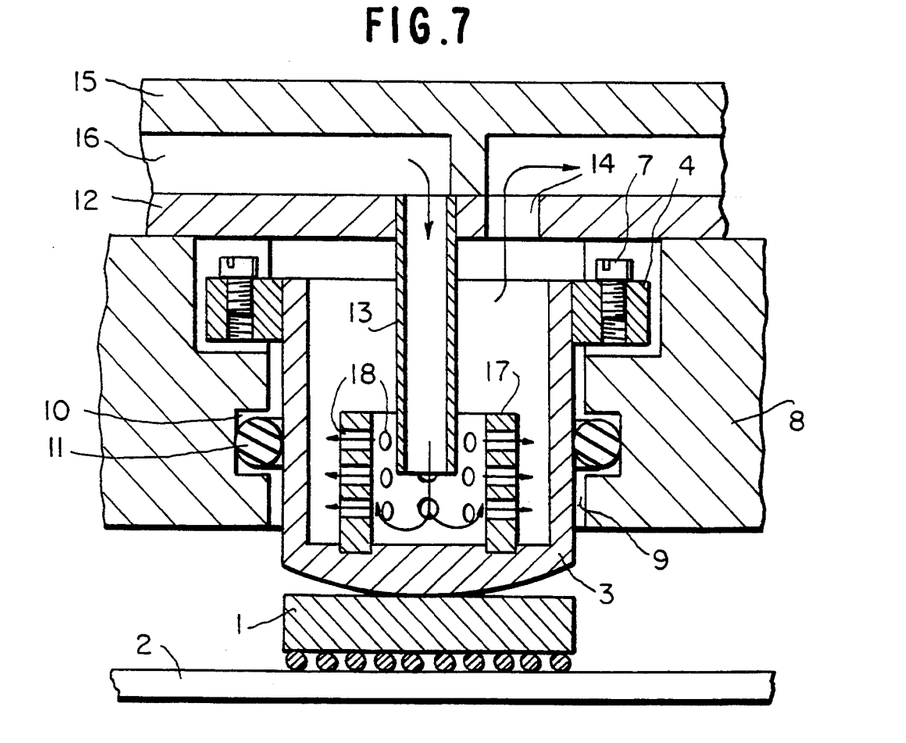
FIG. 7 is a longitudinal cross section of a second embodiment of the present invention.
Figure 8:
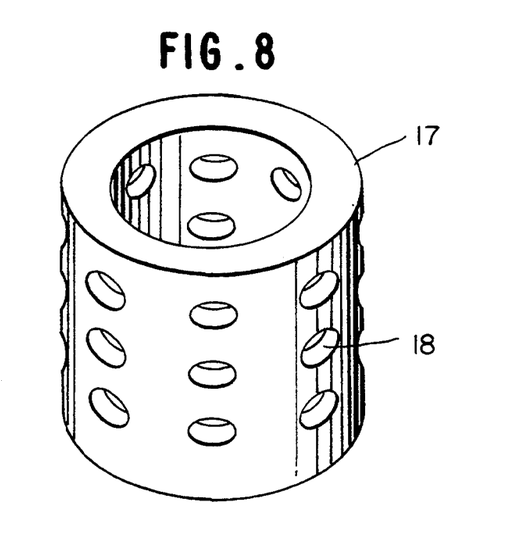
FIG. 8 is a perspective view of a cylindrical fin shown in FIG. 7.

FIG. 7 shows a second embodiment of the present invention which differs from the first embodiment shown in FIGS. 1 to 6 in that a cylindrical fin 17 is provided coaxially on the bottom surface of the piston 3. The cylindrical fin 17 is formed with a plurality of horizontal orifices 18 in a cylindrical wall thereof and has an open upper end in which an end portion of the nozzle 13 is received. The cylindrical fin 17 may be made of the same material as that of the piston 3 and fixedly secured to the bottom surface of the piston 3 by any suitable means such as brazing. FIG. 8 is a perspective view of the cylindrical fin 17.

According to the second embodiment, it is possible to obtain, in addition to the effects obtained by the first embodiment, an effect of increasing a heat exchanging area of the piston 3 given to coolant.

Figure 9:
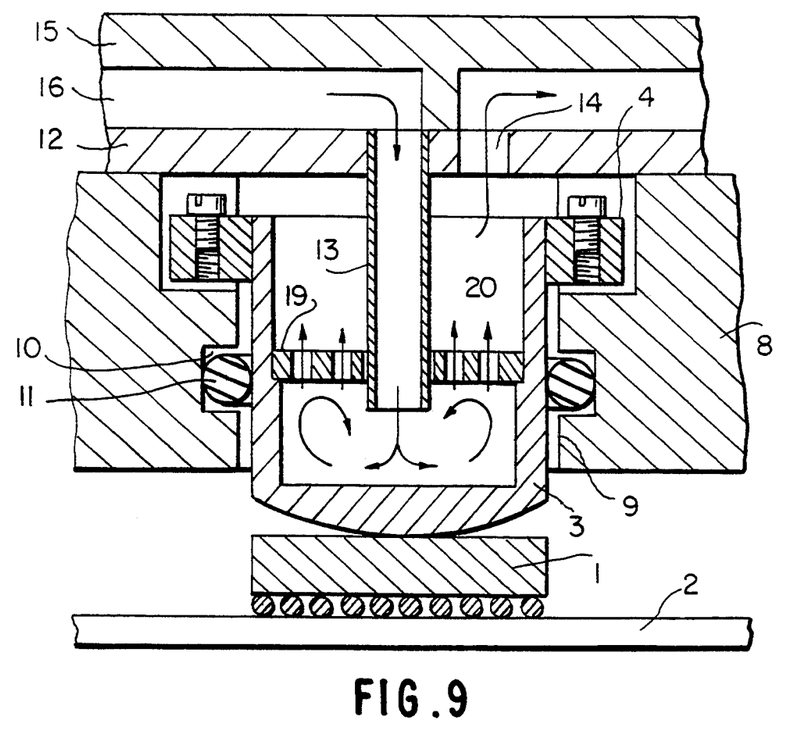
FIG. 9 is a longitudinal cross section of a third embodiment of the present invention.
Figure 10:
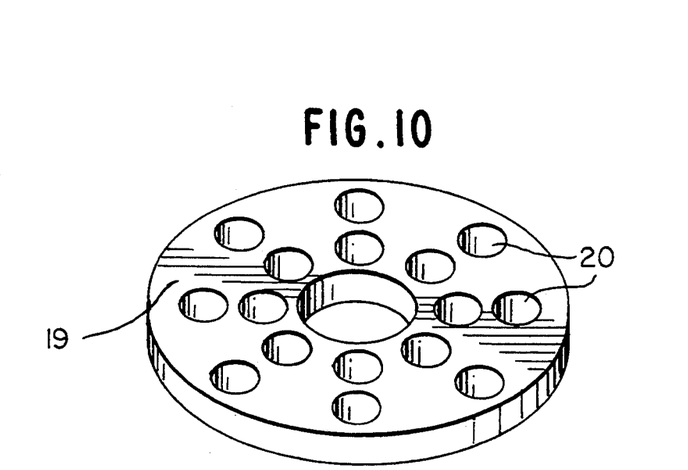
FIG. 10 is a perspective view of a disc fin shown in FIG. 9.

FIG. 9 shows a third embodiment of the present invention. In FIG. 9, a horizontal, disc-like fin 19 is brazed to a middle portion of the inner wall of the piston 3 such that the fin 19 partitions the interior of the piston 3 into an upper portion and a lower portion. The disc-like fin 19 may be formed of the same material as that of the piston 3 and is formed with a plurality of orifices 20 so that liquid coolant can pass therethrough. FIG. 10 is a perspective view of the disc-like fin 19.

According to the third embodiment, it is possible to obtain substantially the same effect obtainable by the second embodiment.

In addition, liquid coolant jetted from the nozzle 13 may generate vortices in the downstream side of the disc fin 19 by which it is possible to increase the heat conductivity between the piston and coolant.

Figure 11:
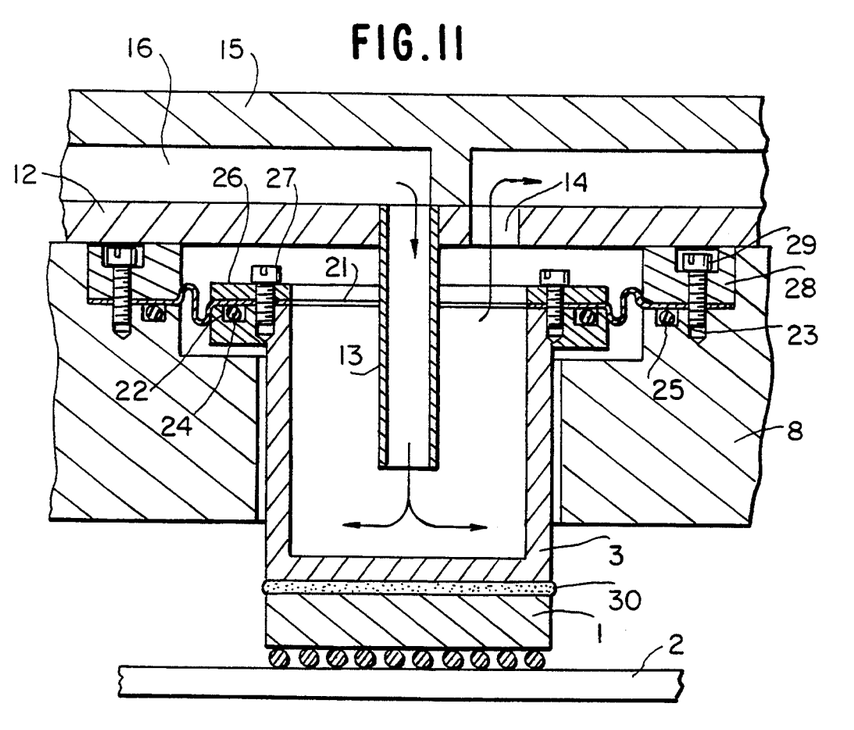
FIG. 11 is a longitudinal cross section of a fourth embodiment of the present invention.

FIG. 11 shows a fourth embodiment of the present invention which comprises a plurality of integrated circuits 1, and a wiring substrate 2 for mounting these integrated circuits and forming connections for a power source and signals. A plurality of cylindrical pistons 3 are provided, with each having an open upper portion, a flange formed on an outside surface of the open upper portion and a flat lower surface. A housing 8 is provided having holes 9 formed in positions corresponding to positions of the respective integrated circuits on the wiring substrate. A thin disc spring 21, which is associated with the housing 8, is provided for supporting each piston 3 through disc shaped members 26 and 28 and screws 27 and 29. The cooling structure further comprises a first cover covering the pistons 3 and the housing 8, the first cover having nozzles 13 for jetting liquid coolant vertically to bottom surfaces of the respective pistons 3 supported by the housing 8 through the disc spring 21 and coolant outlet ports 14 for circulating the liquid coolant which has cooled the interiors of the pistons, and a second cover 15 having coolant passages 16 in the form of grooves for circulating the liquid coolant.

In order to prevent liquid coolant from leaking, O-ring grooves 22 and 23 are formed in the flange of the piston 3 and a shoulder portion of each hole of the housing 8, respectively, in which O-rings 24 and 25 are fitted, respectively.

Figure 12:
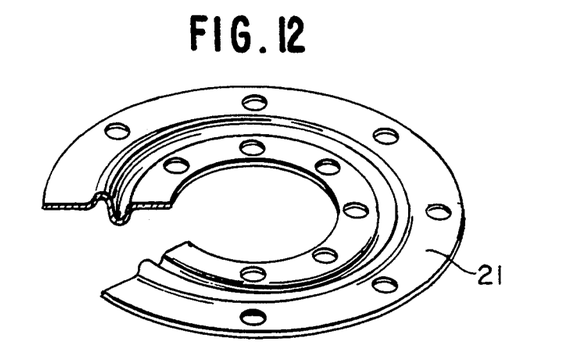
FIG. 12 is a perspective view of a thin leaf spring shown in FIG. 11.

Referring to FIG. 12 which is a perspective view of the thin disc spring 21, the thin disc spring 21 has a corrugated cross sectional structure allowing an elastic deformation in a vertical direction. An inner portion of the thin disc spring 21 is supported between the flange of the piston 3 and the annular member 26 through the screws 27. Further, an outer portion of the disc spring 21 is supported between the shoulder portion of the hole 9 of the housing 8 and an annular member 28 through the screws 29.

The first cover 12 is provided with the nozzles 13 and the coolant outlet ports 14 correspondingly to the pistons 3 received in the respective holes 9 of the housing 8. The second cover 15 is provided with the coolant path grooves 16. The lower surface of the piston 3 supported by the housing 8 through the thin disc spring 21 is in intimate contact with the heat radiating surface of the integrated circuit 1 through thermal compound 30. The liquid coolant path and heat conduction path are similar to those of the first embodiment shown in FIG. 1.

In the fourth embodiment, a cylindrical fin having a number of orifices, such as the cylindrical fin 17 shown in FIG. 8, may be further provided within the piston 3 such that the end portion of the nozzle 13 is surrounded thereby. Alternatively, a disc fin such as disc fin 19 shown in FIG. 10 may be provided to partition the interior of the piston in vertical direction.

Therefore, in the fourth embodiment, it is possible to obtain, in addition to the effects obtainable by the first and second embodiments, a unique effect that, due to elastic deformation of the leaf spring 21, the pistons are regulated in position according to variations of height and inclination of the respective integrated circuits mounted on the wiring substrate, so that the heat radiating surfaces of the integrated circuits can be in stable contact with the flat lower surfaces of the pistons 3.

As described hereinbefore, heat generated by the integrated circuits can be efficiently transmitted to liquid coolant by arranging the cylindrical pistons in opposing relation to the integrated circuits mounted on the wiring substrate and jetting liquid coolant to interiors of the pistons by the nozzles. Further, since it is possible to form each of the pistons with a thick wall, the present invention provides a cooling structure which is durable against corrosion caused by the liquid coolant.

While the present invention has been described in conjunction with the preferred embodiments thereof, it will now be readily possible for those skilled in the art to put this invention into practice in various other manners.

What is claimed is:

1. A cooling structure for an integrated circuit, comprising:
    a wiring substrate;
    an integrated circuit mounted on said wiring substrate;
    a housing having a hole;
    a cylindrical piston for absorbing heat from said integrated circuit, said cylindrical piston being received in said hole of said housing, a lower surface of said cylindrical piston being in contact with said integrated circuit, said cylindrical piston having an open upper portion and a cavity for receiving a liquid coolant through said open upper portion;
    a fixing means provided on an outer side surface of said cylindrical piston for adjusting a height of said cylindrical piston and for fixing said cylindrical piston to said housing by frictional contact with said housing; and
    a nozzle for spraying said liquid coolant on a bottom surface of said cavity of said cylindrical piston.

2. A cooling structure as recited in claim 1, wherein said fixing means comprises:
    a protruding portion protruding from said outer side surface of said cylindrical piston, said protruding portion having a screw hole and a slit; and
    a screw driven into said screw hole of said cylindrical piston for expanding said slit of said protruding portion to make frictional contact between said protruding portion and said housing.

3. A cooling structure as recited in claim 1, further comprising:
    an O-ring provided between said housing and said cylindrical piston.

4. A cooling structure as recited in claim 1, further comprising:
    a cover member secured to said housing, said cover member having a first coolant passage for supplying said liquid coolant to said nozzle and a second coolant passage for discharging said liquid coolant from said cylindrical piston.

5. A cooling structure as recited in claim 1, wherein said cylindrical piston is formed of a material having high heat conductivity and anti-corrosive properties.

6. A cooling structure as recited in claim 5, wherein said material is copper.

* * * * *